United States Patent
Kang et al.

(10) Patent No.: US 12,040,828 B2
(45) Date of Patent: Jul. 16, 2024

(54) COMMUNICATION DEVICE, ELECTRONIC DEVICE INCLUDING COMMUNICATION DEVICE, AND OPERATING METHOD OF ELECTRONIC DEVICE

(71) Applicant: SAMSUNG ELECTRONICS CO., LTD., Suwon-si (KR)

(72) Inventors: Minchul Kang, Suwon-si (KR); Sanghyo Lee, Incheon (KR); Kyeongdo Kim, Gwangmyeong-si (KR); Inhyuk Kim, Hanam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 120 days.

(21) Appl. No.: 17/708,408

(22) Filed: Mar. 30, 2022

(65) Prior Publication Data

US 2022/0376734 A1    Nov. 24, 2022

(30) Foreign Application Priority Data

May 21, 2021    (KR) .......................... 10-2021-0065267

(51) Int. Cl.
| | |
|---|---|
| *H04L 5/16* | (2006.01) |
| *H02J 50/80* | (2016.01) |
| *H03H 7/06* | (2006.01) |
| *H03H 7/38* | (2006.01) |
| *H04B 1/10* | (2006.01) |
| *H04B 1/40* | (2015.01) |

(52) U.S. Cl.
CPC ................ *H04B 1/40* (2013.01); *H02J 50/80* (2016.02); *H03H 7/06* (2013.01); *H03H 7/38* (2013.01); *H04B 1/1018* (2013.01)

(58) Field of Classification Search
CPC ...... H04B 5/0062; H04B 5/02; H04B 5/0025; H04B 1/40; H04B 1/0078; H04B 1/525; H04W 4/80; H03F 2200/318
USPC ......................................................... 375/219
See application file for complete search history.

(56) References Cited

U.S. PATENT DOCUMENTS

| | | | |
|---|---|---|---|
| 8,064,873 B2 | 11/2011 | Wu et al. | |
| 8,670,739 B1 * | 3/2014 | Murphy ............... | H03H 19/002 375/350 |
| 9,019,167 B2 | 4/2015 | Merlin | |
| 9,571,168 B2 | 2/2017 | Moon et al. | |
| 9,806,771 B1 | 10/2017 | Hueber et al. | |

(Continued)

FOREIGN PATENT DOCUMENTS

| | | |
|---|---|---|
| JP | 2005260816 A | 9/2005 |
| JP | 6053442 B2 | 12/2016 |

*Primary Examiner* — Khai Tran
(74) *Attorney, Agent, or Firm* — Sughrue Mion, PLLC

(57) ABSTRACT

A communication device is provided. The communication device includes: an antenna; a matching circuit connected with the antenna; a transmitter configured to generate a transmission communication signal and provide the transmission communication signal to the antenna through the matching circuit; a filter connected between the matching circuit and the antenna; and a receiver configured to receive an attenuated signal from the antenna through the filter. The filter is configured to pass frequencies of an antenna signal corresponding to a pass band and attenuate frequencies of the antenna signal corresponding to a stop band, and a center frequency of the transmission communication signal corresponds to the stop band of the filter.

20 Claims, 11 Drawing Sheets

(56) References Cited

U.S. PATENT DOCUMENTS

| | | |
|---|---|---|
| 10,050,474 B2 | 8/2018 | Ichikawa |
| 10,574,303 B1 | 2/2020 | Hueber et al. |
| 2009/0128261 A1* | 5/2009 | Kayano .................... H01P 1/20 |
| | | 333/202 |
| 2010/0222010 A1* | 9/2010 | Ozaki ..................... H02J 50/60 |
| | | 455/150.1 |
| 2012/0229318 A1* | 9/2012 | Jin ........................ H03H 7/075 |
| | | 333/168 |
| 2017/0338801 A1* | 11/2017 | Hey-Shipton .......... H03H 9/725 |

* cited by examiner

COMMUNICATION DEVICE, ELECTRONIC DEVICE INCLUDING COMMUNICATION DEVICE, AND OPERATING METHOD OF ELECTRONIC DEVICE

CROSS-REFERENCE TO RELATED APPLICATION

This application claims priority to Korean Patent Application No. 10-2021-0065267 filed on May 21, 2021, in the Korean Intellectual Property Office, the disclosure of which is incorporated by reference herein in its entirety.

BACKGROUND

Methods, systems and apparatuses consistent with example embodiments relate to an electronic device, and more particularly, to a communication device which prevents a receiver from being saturated by a strong disturbance signal, an electronic device including the communication device, and an operating method of the electronic device.

A communication device may exchange information with an external device by using wireless communication. Mobile electronic devices such as a smartphone and a smart pad may include a communication device for exchanging information with the external device.

However, signals in various frequency bands may interfere with communication with the external device. For example, as new functions are adopted by mobile electronic devices, signals in new frequency bands may be used by the mobile electronic devices, and these signals in the new frequency bands may act as a noise at existing communication devices.

For example, in the case where a strength of a signal in a new frequency band is stronger than strengths of signals that the communication devices use to communicate, the communication devices may be saturated by the signal in the new frequency band. In this case, the communication devices are incapable of exchanging information, and an abnormal operation occurs.

SUMMARY

Example embodiments provide a communication device with improved reliability and reduced power consumption, an electronic device including the communication device, and an operating method of the electronic device.

According to an aspect of an example embodiment, a communication device includes: an antenna; a matching circuit connected with the antenna; a transmitter configured to generate a transmission communication signal and provide the transmission communication signal to the antenna through the matching circuit; a filter connected between the matching circuit and the antenna; and a receiver configured to receive an attenuated signal from the antenna through the filter. The filter is configured to pass frequencies of an antenna signal corresponding to a pass band and attenuate frequencies of the antenna signal corresponding to a stop band, and a center frequency of the transmission communication signal corresponds to the stop band of the filter.

According to an aspect of an example embodiment, an electronic device includes: a wireless charger circuit configured to exchange power with an external power device through a charging signal; a power management integrated circuit configured to provide power received from the wireless charger circuit to a battery or to output power from the battery through the wireless charger circuit; a communication device configured to communicate with an external device through a communication signal; and a processor configured to execute an operating system and applications, and to exchange information with the external device through the communication device. The power management integrated circuit is further configured to provide power to the communication device and the processor, the communication device includes a filter configured to pass frequencies of the communication signal corresponding to a pass band and attenuate frequencies of the communication signal corresponding to a stop band, and a frequency of the charging signal and a center frequency of the communication signal correspond to the stop band of the filter.

According to an aspect of an example embodiment, an operating method of an electronic device which includes an antenna, a filter, and a receiver, is provided. The method includes: generating, at the filter, an attenuated signal by filtering an antenna signal provided on the antenna; and extracting, at the receiver, information from the attenuated signal. The filter is configured to pass frequencies corresponding to a pass band and attenuate frequencies corresponding to a stop band, and a center frequency of a communication signal of the receiver corresponds to the stop band of the filter.

BRIEF DESCRIPTION OF THE DRAWINGS

The above and other objects, features and advantages will become apparent from the following descriptions, taken in conjunction with reference the accompanying drawings in which.

DETAILED DESCRIPTION

Below, example embodiments will be described in detail with reference to the accompanying drawings.

Figure 1:
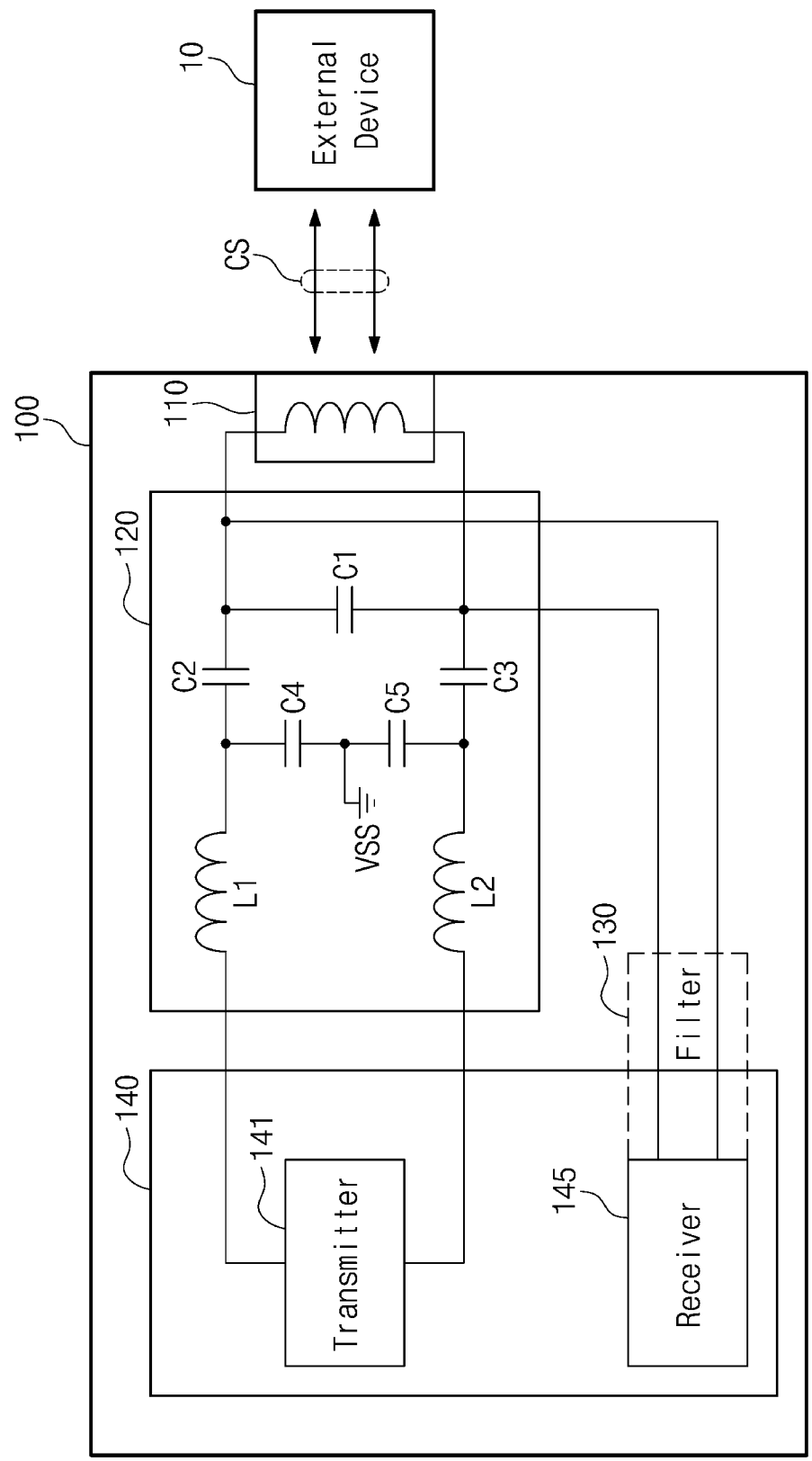
FIG. 1 illustrates a communication device and an external device according to an example embodiment.

FIG. 1 illustrates a communication device 100 and an external device 10 according to an example embodiment. Referring to FIG. 1, the communication device 100 may include an antenna 110, a matching circuit 120, a filter 130, and an integrated circuit 140. In an example embodiment, the communication device 100 may exchange a communication signal with the external device 10 in compliance with a protocol for near field communication (NFC).

The antenna 110 may transmit a communication signal CS to the external device 10 and may receive the communication signal CS from the external device 10. The antenna 110 may include at least one turn of a conductive material.

The matching circuit 120 may be connected between the integrated circuit 140 and the antenna 110. The matching circuit 120 may provide impedance matching between the integrated circuit 140 and the antenna 110. For example, the matching circuit 120 may provide impedance matching between a transmitter 141 of the integrated circuit 140 and the antenna 110.

The matching circuit 120 may include first to fifth capacitors C1 to C5, and first and second inductors L1 and L2. The first capacitor C1 may be connected between a first node and a second node of the antenna 110.

The second capacitor C2 and the first inductor L1 may be connected in series between the first node of the antenna 110 and a first node of the transmitter 141. The third capacitor C3 and the second inductor L2 may be connected in series between the second node of the antenna 110 and a second node of the transmitter 141.

The fourth capacitor C4 may be connected between a node that is provided between the second capacitor C2 and the first inductor L1, and a ground node to which a ground voltage VSS is supplied. The fifth capacitor C5 may be connected between a node that is provided between the third capacitor C3 and the second inductor L2, and the ground node to which the ground voltage VSS is supplied.

The filter 130 may be connected between the first node of the antenna 110 and a first node of a receiver 145, and between the second node of the antenna 110 and a second node of the receiver 145. The filter 130 may perform filtering on a signal of the antenna 110. The filter 130 may include a pass band and a stop band.

The filter 130 may pass a portion (or component) of the signal on the antenna 110, which corresponds to the pass band, to the receiver 145. The filter 130 may attenuate a portion (or component) of the signal on the antenna 110, which corresponds to the stop band, and may transfer an attenuated signal including the attenuated portion (or component) to the receiver 145.

In an example embodiment, the filter 130 may be implemented with any one or any combination of various filters including a low pass filter (LPF), a high pass filter (HPF), and a band pass filter. The filter 130 may be implemented with an n-th order filter (n being a positive integer).

The integrated circuit 140 may include the transmitter 141 and the receiver 145. The transmitter 141 may transmit the communication signal CS to the external device 10 through the matching circuit 120 and the antenna 110. The transmitter 141 may transmit the communication signal CS, with information added to a signal having a center frequency.

For example, the center frequency of the communication signal CS may be in the range of tens of (e.g., ten to 99) megahertz (MHz). In an example embodiment, the center frequency of the communication signal CS may be 13.56 MHz that is defined by the protocol for near field communication (NFC). For example, the transmitter 141 may add information to the signal having the center frequency by performing load modulation. The load modulation may include active load modulation (ALM) or passive load modulation (PLM).

The receiver 145 may receive the communication signal CS received by the antenna 110 through the filter 130 as an attenuated signal. The receiver 145 may perform demodulation on the attenuated signal to extract information from the attenuated signal. In an example embodiment, the integrated circuit 140 may be implemented with one semiconductor chip.

The filter 130 is illustrated in FIG. 1 as being across the outside and inside of the integrated circuit 140. For example, any one or any combination of components of the filter 130 may be implemented in the integrated circuit 140 together with the transmitter 141 and the receiver 145.

Figure 2:
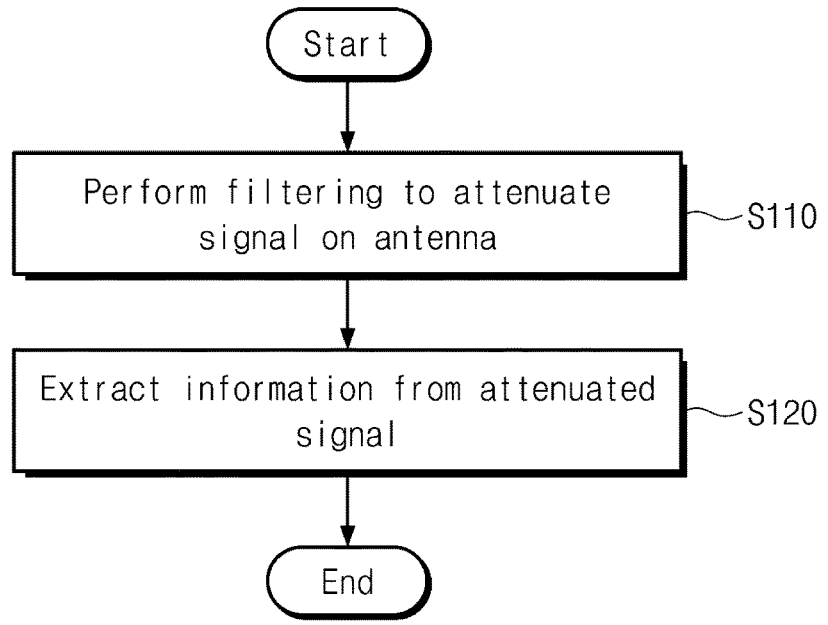
FIG. 2 illustrates an example of an operating method of a communication device according to an example embodiment.

FIG. 2 illustrates an example of an operating method of the communication device 100. Referring to FIGS. 1 and 2, in operation S110, the filter 130 of the communication device 100 may perform filtering on a signal (e.g., the communication signal CS) on the antenna 110 to attenuate the communication signal CS.

For example, the filter 130 may attenuate components corresponding to the stop band from among frequency components of the communication signal CS. The filter 130 may pass components corresponding to the pass band from among the frequency components of the communication signal CS without attenuation. The filter 130 may generate the attenuated signal by attenuating at least a portion of the communication signal CS and may transfer the attenuated signal to the receiver 145.

In operation S120, the receiver 145 may extract information from the attenuated signal. For example, the receiver 145 may mix the attenuated signal and the signal having the center frequency, and may extract an information signal in a baseband by performing low pass filtering on a result of the mixing.

Figure 3:
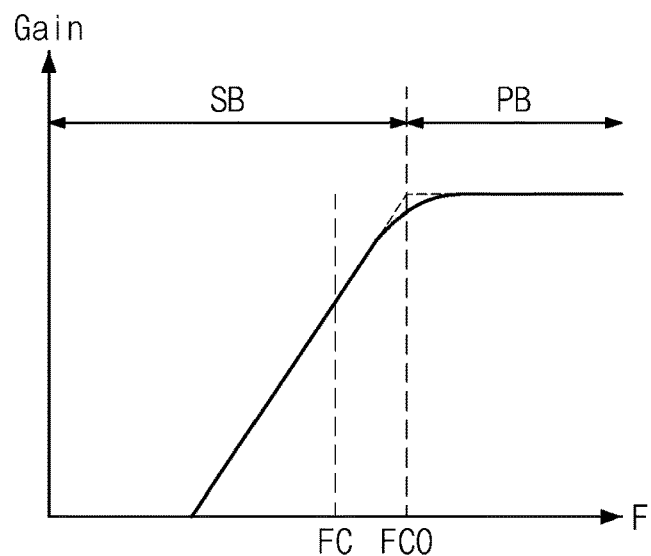
FIG. 3 illustrates an example of a frequency response characteristic of a filter according to an example embodiment.

FIG. 3 illustrates an example of a frequency response characteristic of the filter 130. In an example embodiment, the filter 130 may be implemented with a first-order high pass filter (HPF). In FIG. 3, a horizontal axis represents a frequency "F", and a vertical axis represents a gain.

Referring to FIGS. 1, 2, and 3, a cutoff frequency FCO may be defined at a frequency response of the filter 130. The cutoff frequency FCO may indicate a frequency at which a gain of the filter 130 is −3 dB. When the filter 130 is implemented with a high pass filter, a frequency band higher than the cutoff frequency FCO may be a pass band PB. A frequency band lower than the cutoff frequency FCO may be a stop band SB.

In an example embodiment, a center frequency FC of the communication signal CS may correspond to the stop band SB of the filter 130. That is, the filter 130 may also attenuate the center frequency FC of the communication signal CS and an information signal added to the center frequency FC.

In an example embodiment, a strength of an output signal of the transmitter 141 and a strength of a signal that the receiver 145 is capable of identifying may be different. The strength of the output signal of the transmitter 141 may correspond to a high voltage of 20V or higher. In contrast, the strength of the signal that the receiver 145 is capable of identifying may be 2V or a voltage similar to 2V. That is, the strength of the signal that the receiver 145 is capable of identifying may correspond to $\frac{1}{10}$ of the strength of the output signal of the transmitter 141 or a value similar thereto.

According to the protocol for near field communication (NFC), while the communication signal CS is received through the antenna 110 and is being transferred to the receiver 145, the communication signal CS may also be transmitted through the antenna 110 by the transmitter 141. That is, the communication signal CS for transmission and the communication signal CS for reception may coexist at the antenna 110. In the case where a strength of the communication signal CS for transmission is not attenuated, the receiver 145 may be saturated, and the receiver 145 may not operate.

In general, a voltage divider that uses resistors may be used to attenuate a strength of a signal. However, the voltage divider using resistors may cause heat (or heat generation), and the heat (or heat generation) may cause power consumption. In contrast, the communication device 100 according to an example embodiment may attenuate a strength of the communication signal CS for transmission by using an attenuation rate of the stop band SB of the filter 130. Accordingly, without generating additional heat and consuming additional power due to the heat generated by additional resistors, the receiver 145 may not be saturated and may operate normally.

In an example embodiment, a gain for the center frequency FC of the filter 130 may be −20 dB or more. Alternatively, an attenuation rate for the center frequency FC of the filter 130 may be 20 dB or more.

Figure 4:
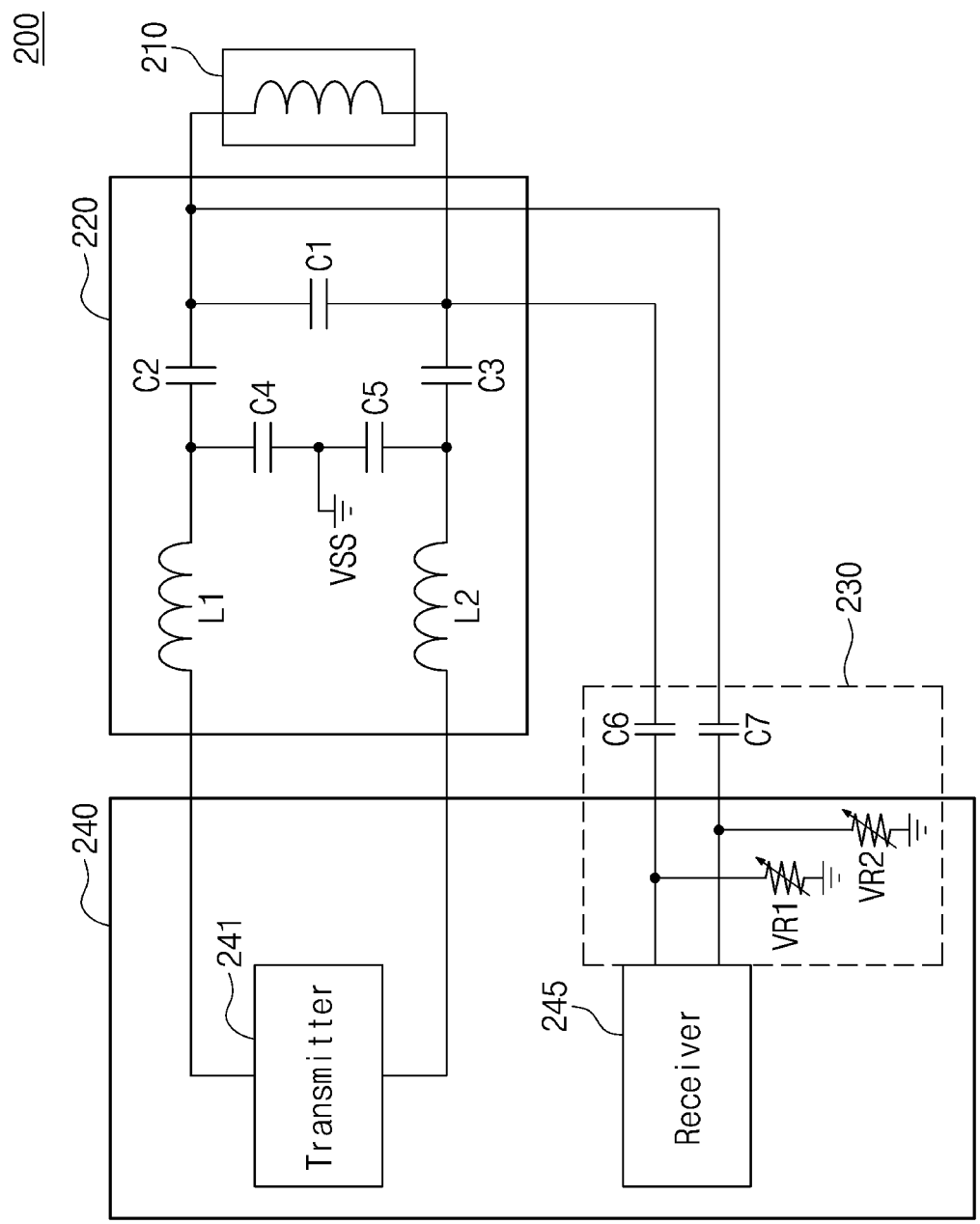
FIG. 4 illustrates an example of a communication device including a filter implemented according to an example embodiment.

FIG. 4 illustrates an example of a communication device 200 including a filter 230 implemented according to a first example embodiment. The communication device 200 may be an implementation example of the communication device 100 of FIG. 1. Referring to FIG. 4, the communication device 200 may include an antenna 210, a matching circuit 220, the filter 230, and an integrated circuit 240. The integrated circuit 240 may include a transmitter 241 and a receiver 245.

A configuration and an operation of the antenna 210, the matching circuit 220, the transmitter 241, and the receiver 245 may be substantially similar to those of the antenna 110, the matching circuit 120, the transmitter 141, and the receiver 145 described with reference to FIG. 1. Thus, additional description will be omitted to avoid redundancy.

The filter 230 may include a sixth capacitor C6 connected between a second node of the antenna 210 and a second node of the receiver 245 and a seventh capacitor C7 connected between a first node of the antenna 210 and a first node of the receiver 245. The filter 230 may further include a first resistor VR1 connected between the second node of the receiver 245 and the ground node and a second resistor VR2 connected between the first node of the receiver 245 and the ground node.

In an example embodiment, the first resistor VR1 and the second resistor VR2 may be implemented with variable resistors. The first resistor VR1 and the second resistor VR2 may be implemented with termination resistors of the receiver 245. The sixth capacitor C6, the seventh capacitor C7, the first resistor VR1, and the second resistor VR2 may constitute a high pass filter (HPF).

In an example embodiment, the first resistor VR1 and the second resistor VR2 may be implemented in the integrated circuit 240 together with the transmitter 241 and the receiver 245. For example, the first resistor VR1 and the second resistor VR2 may be on-chip resistors.

In an example embodiment, each of the sixth capacitor C6 and the seventh capacitor C7 may have a capacitance ranging from 5 pF to 10 pF. Each of the first resistor VR1 and the second resistor VR2 may have a resistance value ranging from 100 ohm to 200 ohm.

When each of the sixth capacitor C6 and the seventh capacitor C7 has a capacitance of 10 pF and each of the first resistor VR1 and the second resistor VR2 has a resistance value of 100 ohm, a gain for the center frequency FC (refer to FIG. 3) of the filter 230 may be −22.1 dB. Alternatively, an attenuation rate for the center frequency FC of the filter 230 may be 22.1 dB.

When each of the sixth capacitor C6 and the seventh capacitor C7 has a capacitance of 5 pF and each of the first resistor VR1 and the second resistor VR2 has a resistance value of 200 ohm, a gain for the center frequency FC of the filter 230 may be −22.1 dB. Alternatively, an attenuation rate for the center frequency FC of the filter 230 may be 22.1 dB.

Figure 5:
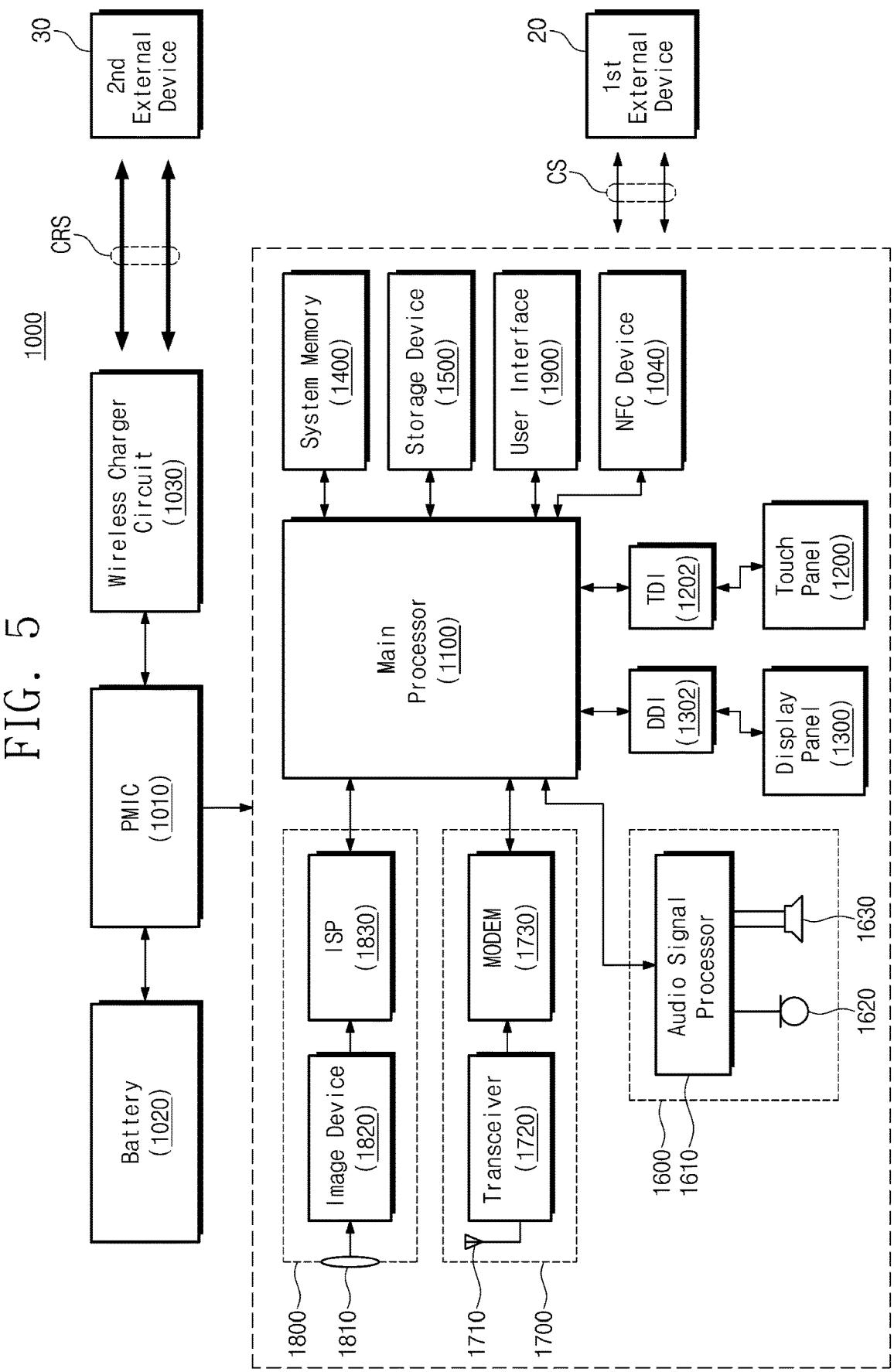
FIG. 5 illustrates an example of an electronic device including a communication device according to an example embodiment.

FIG. 5 illustrates an example of an electronic device 1000 including the communication device 100 of FIG. 1. Referring to FIG. 5, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an example embodiment, the electronic device 1000 may be one of various electronic devices such as a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may perform various operations for the purpose of operating the electronic device 1000. The main processor 1100 may execute an operating system and applications.

The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase change RAM (PRAM), a magneto-resistive RAM (MRAM), a resistive RAM (ReRAM), or a ferroelectric RAM (FRAM).

The storage device 1500 may store data regardless of whether power is supplied. For example, the storage device 1500 may include any one or any combination of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on any one or any combination of various wireless communication protocols: long term evolution (LTE), worldwide interoperability for microwave access (WiMax), global system for mobile communication (GSM), code division multiple access (CDMA), Bluetooth, wireless fidelity (Wi-Fi), and radio frequency identification (RFID). The image processor 1800 may receive a light through a lens 1810. An image device 1820 and an image signal processor (ISP) 1830 included in the image processor 1800 may generate image information about an external object, based on a received light. The user interface 1900 may include an interface capable of exchanging information with a user, and may include a keyboard, a mouse, a printer, a projector, various sensors, a human body communication device, etc.

The electronic device 1000 may further include a power management IC (PMIC) 1010, a battery 1020, and a wireless charger circuit 1030. The power management IC 1010 may generate internal power based on power supplied from the battery 1020 or power supplied from the wireless charger circuit 1030, and may provide the internal power to the main processor 1100, the touch panel 1200, the touch driver integrated circuit 1202, the display panel 1300, the display driver integrated circuit 1302, the system memory 1400, the storage device 1500, the audio processor 1600, the communication block 1700, the image processor 1800, and the user interface 1900.

The wireless charger circuit 1030 may exchange a charging signal CRS with a second external device 30. The second external device 30 may be a device that provides charging. The wireless charger circuit 1030 may receive the charging signal CRS from the second external device 30 and may transfer power of the charging signal CRS to the power management IC 1010. The power management IC 1010 may charge the battery 1020 based on the power from the wireless charger circuit 1030.

The second external device 30 may be a device that requires charging. The power management IC 1010 may transfer power provided from the battery 1030 to the wireless charger circuit 1030. The wireless charger circuit 1030 may generate the charging signal CRS by using the power transferred from the power management IC 1010 and may transmit the charging signal CRS to the second external device 30.

The electronic device 1000 may further include a near-field communication device 1040 (i.e., an NFC device). The near-field communication device 1040 may include the communication device 100 described with reference to FIG. 1. The near-field communication device 1040 may transmit and receive the communication signals CS to and from a first external device 20.

In an example embodiment, a frequency of the charging signal CRS and a frequency (e.g., the center frequency FC) of the communication signal CS may be different. Because the charging signal CRS is used to transmit power, a strength of the charging signal CRS may be greater than a strength of the communication signal CS. When the strength of the charging signal CRS is greater than the strength of the communication signal CS, the charging signal CRS may saturate a receiver, e.g., the receiver 145 shown in FIG. 1 or the filter 245 shown in FIG. 4, of the near-field communication device 1040 even though frequencies of the charging signal CRS and the communication signal CS are different.

A filter, e.g., the filter 130 shown in FIG. 1 or the filter 230 shown in FIG. 4, of the near-field communication device 1040 according to an example embodiment may apply different attenuation rates to the charging signal CRS and the communication signal CS based on that frequencies of the charging signal CRS and the communication signal CS are different. In an example embodiment, the filter 130 or 230 may be implemented such that an attenuation rate for a frequency of the charging signal CRS is greater than an attenuation rate of a frequency (e.g., the center frequency FC) of the communication signal CS. Alternatively, the filter 130 or 230 may be implemented such that a gain for a frequency of the charging signal CRS is greater than a gain of a frequency (e.g., the center frequency FC) of the communication signal CS.

Figure 6:
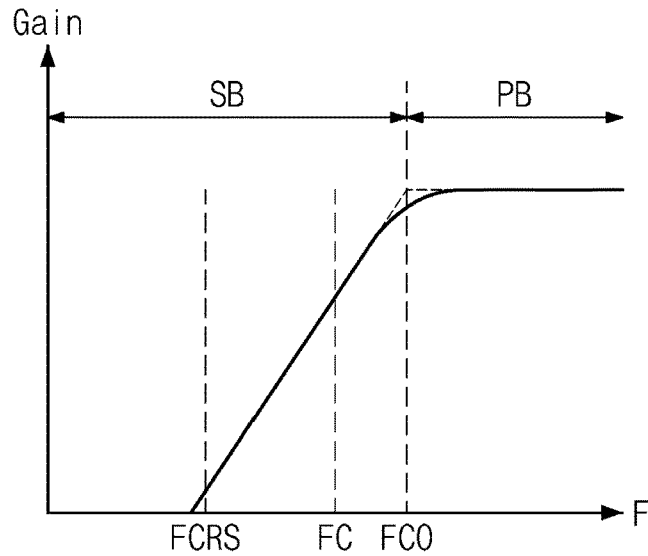
FIG. 6 further illustrates a frequency of a charging signal in addition to a frequency response characteristic according to an example embodiment.

FIG. 6 further illustrates a frequency FCRS of the charging signal CRS in addition to a frequency response characteristic of FIG. 3. In an example embodiment, the frequency FCRS of the charging signal CRS may be lower than the center frequency FC of the communication signal CS. Accordingly, when the filter 230 is implemented with the high pass filter (HPF) as described with reference to FIG. 4, an attenuation rate for the frequency FCRS of the charging signal CRS may be greater than an attenuation rate for the center frequency FC of the communication signal CS. Alternatively, a gain for the frequency FCRS of the charging signal CRS may be smaller than a gain of the center frequency FC of the communication signal CS.

In an example embodiment, the attenuation rate for the frequency FCRS of the charging signal CRS of the filter 230 may be 60 dB or more. A gain for the frequency FCRS of the charging signal CRS of the filter 230 may be −60 dB or less.

When each of the sixth capacitor C6 and the seventh capacitor C7 has a capacitance of 10 pF and each of the first resistor VR1 and the second resistor VR2 has a resistance value of 100 ohm, a gain for the frequency FCRS of the charging signal CRS may be −60.5 dB. Alternatively, the attenuation rate for the frequency FCRS of the charging signal CRS of the filter 230 may be 60.5 dB.

When each of the sixth capacitor C6 and the seventh capacitor C7 has a capacitance of 5 pF and each of the first resistor VR1 and the second resistor VR2 has a resistance value of 200 ohm, a gain for the frequency FCRS of the charging signal CRS may be −60.5 dB. Alternatively, the attenuation rate for the frequency FCRS of the charging signal CRS of the filter 230 may be 60.5 dB.

In an example embodiment, it is assumed that the frequency FCRS of the charging signal CRS is lower than the center frequency FC of the communication signal CS. However, example embodiments are not limited thereto and the frequency FCRS of the charging signal CRS may be higher than the center frequency FC of the communication signal CS. Depending on a relationship between the frequency FCRS of the charging signal CRS and the center frequency FC of the communication signal CS, the filter 130 may be implemented with any one or any combination of various filters including the low pass filter (LPF), the high pass filter (HPF), and the band pass filter (BPF).

Also, the electronic device 1000 may be exposed to other wireless signals, in addition to the charging signal CRS. The filter 130 may be implemented to apply an attenuation rate greater than the attenuation rate of the center frequency FC or a gain smaller than the gain of the center frequency FC, to a frequency of other signals capable of causing the saturation of the receiver 145 (or capable of hindering a normal operation of the receiver 145), as well as the charging signal CRS.

Figure 7:
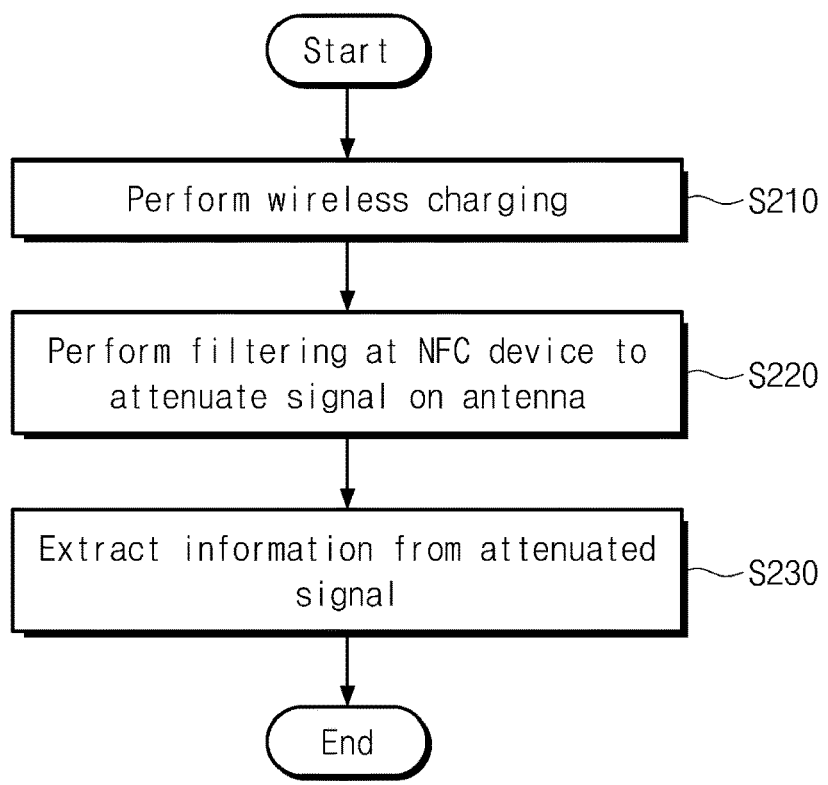
FIG. 7 illustrates an example of an operating method of an electronic device according to an example embodiment.

FIG. 7 illustrates an example of an operating method of the electronic device 1000. Referring to FIGS. 1, 5, and 7, in operation S210, the electronic device 1000 may perform wireless charging. For example, the electronic device 1000 may receive the charging signal CRS from the second external device 30 through the wireless charger circuit 1030.

The power management IC 1010 may provide power included in the charging signal CRS to the battery 1020 to charge the battery 1020.

For another example, the power management IC 1010 may allow the wireless charger circuit 1030 to generate the charging signal CRS by using power of the battery 1020. The wireless charger circuit 1030 may provide power to the second external device 30 by transmitting the charging signal CRS to the second external device 30.

In an example embodiment, a signal may be formed at the antenna 110 of the near-field communication device 1040 by the charging signal CRS. The signal formed on the antenna 110 by the charging signal CRS may be transferred to the receiver 145 through the filter 130.

In operation S220, the electronic device 1000 may attenuate the signal on the antenna 210 through filtering of the filter 130 of the near-field communication device 1040. As described with reference to FIG. 6, the filter 130 may more attenuate a component of the frequency FCRS corresponding to the charging signal CRS, compared to a component of the center frequency FC corresponding to the communication signal CS.

In an example embodiment, the component of the frequency FCRS corresponding to the charging signal CRS may be attenuated to such an extent as to have no influence on the receiver 145, to such an extent as not to hinder a normal operation of the receiver 145, or to such an extent as not to saturate at least the receiver 145. The filter 130 may transfer an attenuated signal to the receiver 145.

In operation S230, the receiver 145 may extract information from the attenuated signal. A component of the attenuated signal, which corresponds to the center frequency FC of the communication signal CS, is attenuated to a strength appropriate for the receiver 145 to extract information. A component of the attenuated signal, which corresponds to the frequency FCRS of the charging signal CRS, is attenuated to a level that the charging signal CRS does not cause an abnormal operation when the receiver 145 extracts information. Accordingly, the receiver 145 may extract information from the attenuated signal without having an influence of the interference of the charging signal CRS.

Also, as described with reference to FIG. 4, the filter 230 may be implemented in the form of a filter including capacitors and resistors, without a voltage divider including resistors. Accordingly, heat generation and power consumption due to the heat generation may be prevented.

Figure 8:
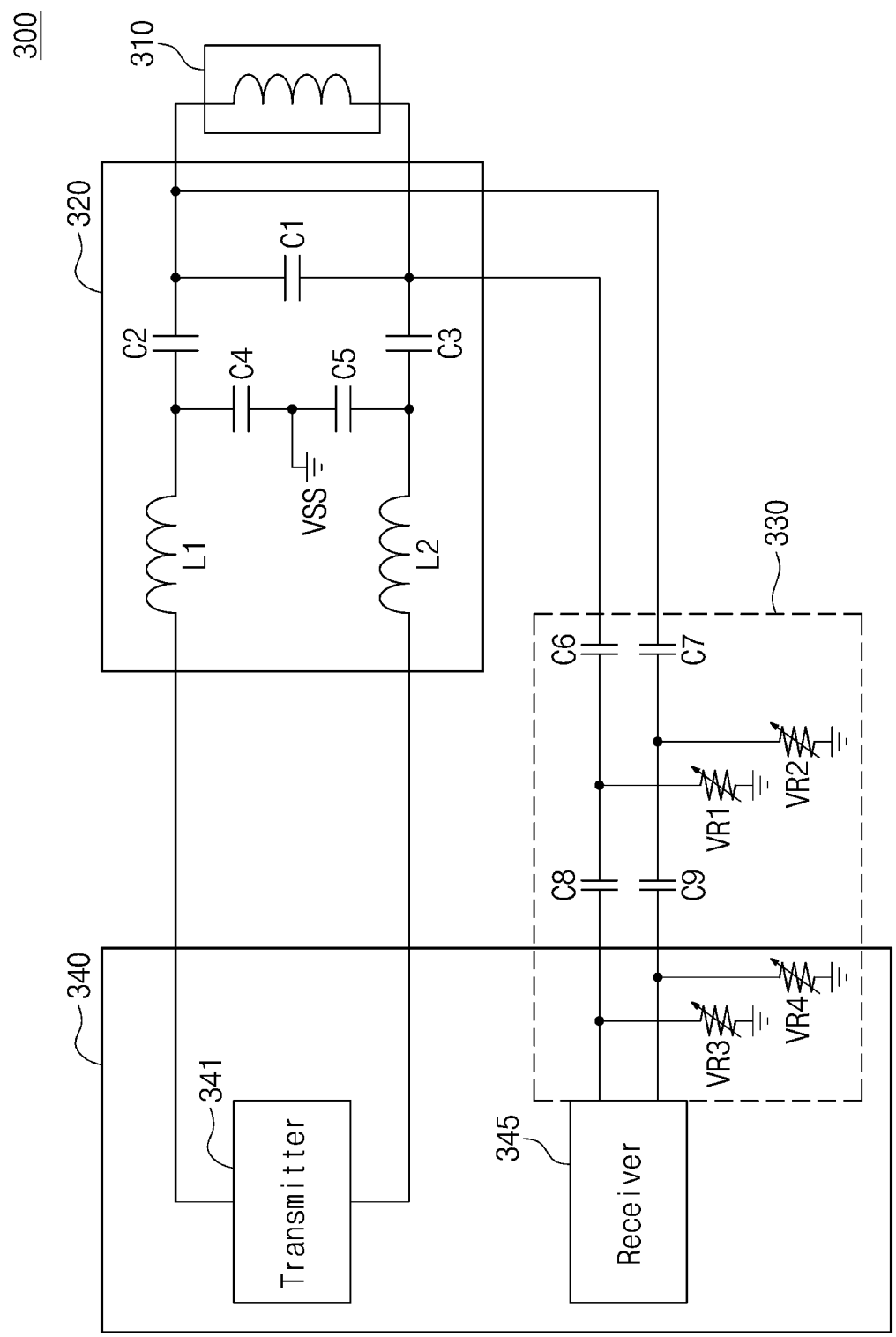
FIG. 8 illustrates an example of a communication device including a filter implemented according to an example embodiment.

FIG. 8 illustrates an example of a communication device 300 including a filter 330 implemented according to a second example embodiment. The communication device 300 may be an implementation example of the communication device 100 of FIG. 1. Referring to FIG. 8, the communication device 300 may include an antenna 310, a matching circuit 320, the filter 330, and an integrated circuit 340. The integrated circuit 340 may include a transmitter 341 and a receiver 345.

A configuration and an operation of the antenna 310, the matching circuit 320, the transmitter 341, and the receiver 345 may be substantially similar to those of the antenna 110, the matching circuit 120, the transmitter 141, and the receiver 145 described with reference to FIG. 1. Thus, additional description will be omitted to avoid redundancy.

Referring to FIG. 8, the filter 330 may include the sixth capacitor C6, the seventh capacitor C7, an eighth capacitor C8, a ninth capacitor C9, the first resistor VR1, the second resistor VR2, a third resistor VR3, and a fourth resistor VR4.

The sixth capacitor C6 and the eighth capacitor C8 may be connected in series between a second node of the antenna 310 and a second node of the receiver 345. The first resistor VR1 may be connected between a node between the sixth capacitor C6 and the eighth capacitor C8, and the ground node. The third resistor VR3 may be connected between the second node of the receiver 345 and the ground node.

The seventh capacitor C7 and the ninth capacitor C9 may be connected in series between a first node of the antenna 310 and a first node of the receiver 345. The second resistor VR2 may be connected between a node between the seventh capacitor C7 and the ninth capacitor C9, and the ground node. The fourth resistor VR4 may be connected between the first node of the receiver 345 and the ground node.

In an example embodiment, any one or any combination of the first resistor VR1, the second resistor VR2, the third resistor VR3, and the fourth resistor VR4 may be implemented with a variable resistor. The third resistor VR3 and the fourth resistor VR4 may be implemented with termination resistors of the receiver 345. In an example embodiment, the third resistor VR3 and the fourth resistor VR4 may be implemented in the integrated circuit 340 together with the transmitter 341 and the receiver 345. For example, the third resistor VR3 and the fourth resistor VR4 may be on-chip resistors.

In an example embodiment, the filter 330 may be implemented with a second-order high pass filter (HPF). The filter 330 may include a pass band corresponding to a frequency band higher than a cutoff frequency and a stop band corresponding to a frequency band lower than the cutoff frequency. The center frequency FC of the communication signal CS may correspond to the stop band. The filter 330 may apply attenuation of 20 dB or more and a gain of −20 dB or less to the stop band.

Also, the filter 330 may be configured to apply attenuation greater than attenuation for the center frequency FC or a gain smaller than a gain for the center frequency FC to a frequency band of any other signal capable of hindering a normal operation of the receiver 345, like the charging signal CRS.

Figure 9:
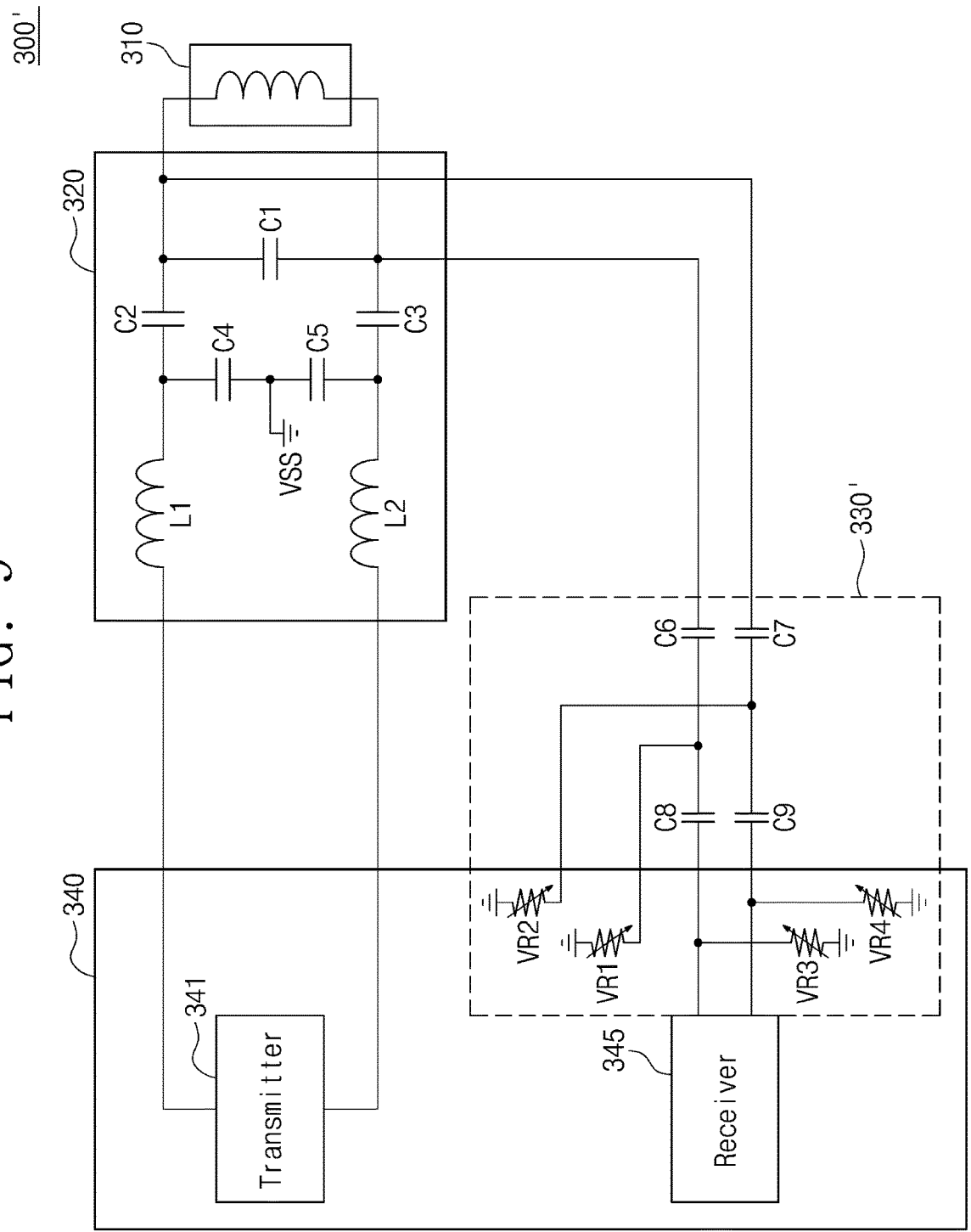
FIG. 9 illustrates an example of a communication device according to an example embodiment.

FIG. 9 illustrates a modified example of the communication device 300 of FIG. 8. Compared to the communication device 300 of FIG. 8, the first resistor VR1 and the second resistor VR2 of a filter 330' of a communication device 300' of FIG. 9 may be implemented in the integrated circuit 340. For example, the first resistor VR1 and the second resistor VR2 may be implemented with on-chip resistors.

Figure 10:
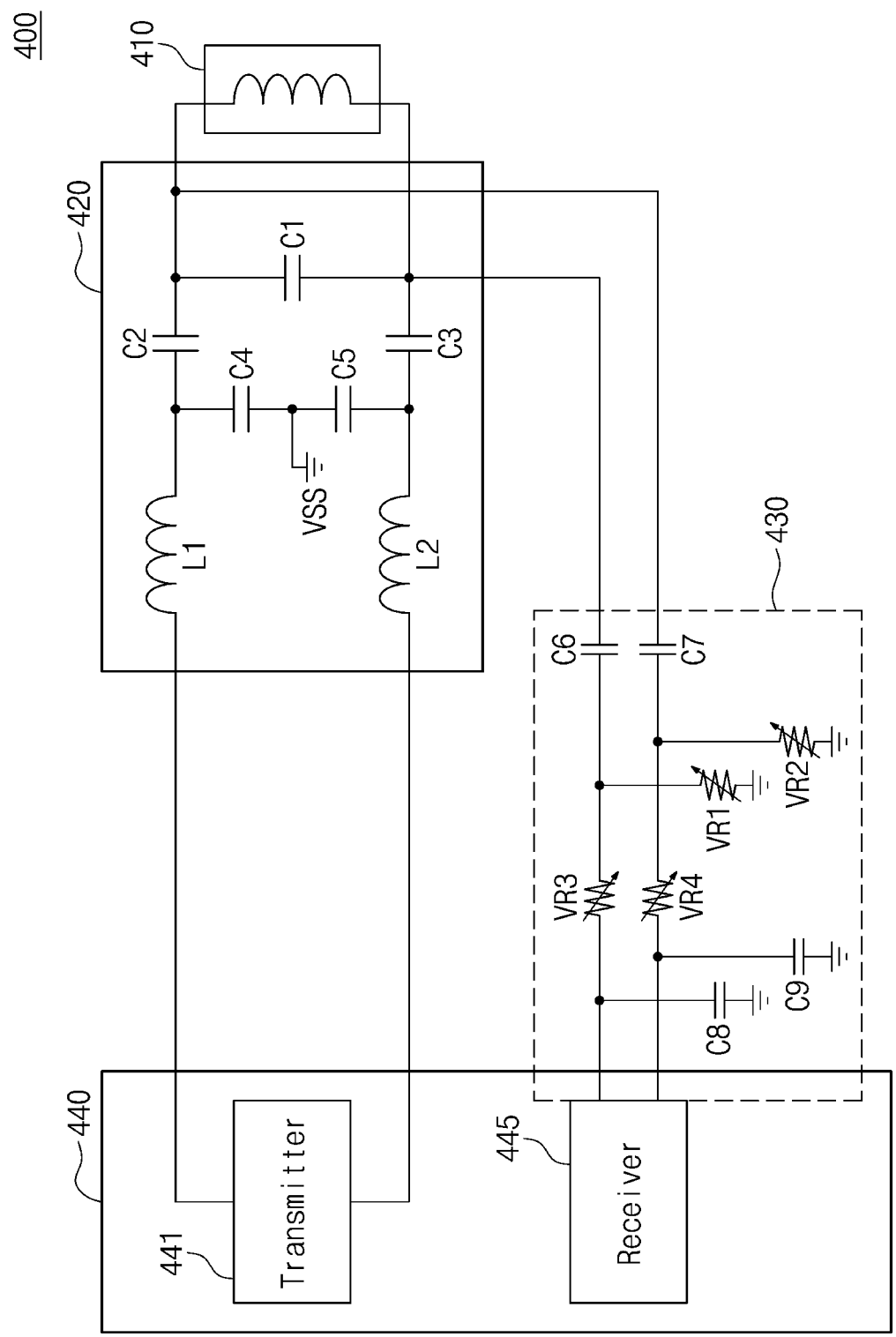
FIG. 10 illustrates an example of a communication device including a filter implemented according to an example embodiment.

FIG. 10 illustrates an example of a communication device 400 including a filter 430 implemented according to a third example embodiment. The communication device 400 may be an implementation example of the communication device 100 of FIG. 1. Referring to FIG. 10, the communication device 400 may include an antenna 410, a matching circuit 420, the filter 430, and an integrated circuit 440. The integrated circuit 440 may include a transmitter 441 and a receiver 445.

A configuration and an operation of the antenna 410, the matching circuit 420, the transmitter 441, and the receiver 445 may be substantially similar to those of the antenna 110, the matching circuit 120, the transmitter 141, and the receiver 145 described with reference to FIG. 1. Thus, additional description will be omitted to avoid redundancy.

Referring to FIG. 10, the filter 430 may include the sixth capacitor C6, the seventh capacitor C7, the eighth capacitor C8, the ninth capacitor C9, the first resistor VR1, the second resistor VR2, the third resistor VR3, and the fourth resistor VR4.

The sixth capacitor C6 and the third resistor VR3 may be connected in series between a second node of the antenna 410 and a second node of the receiver 445. The first resistor VR1 may be connected between a node between the sixth capacitor C6 and the third resistor VR3, and the ground node. The eighth capacitor C8 may be connected between the second node of the receiver 445 and the ground node.

The seventh capacitor C7 and the fourth resistor VR4 may be connected in series between a first node of the antenna 410 and a first node of the receiver 445. The second resistor VR2 may be connected between a node between the seventh capacitor C7 and the fourth resistor VR4, and the ground node. The ninth capacitor C9 may be connected between the first node of the receiver 445 and the ground node.

In an example embodiment, any one or any combination of the first resistor VR1, the second resistor VR2, the third resistor VR3, and the fourth resistor VR4 may be implemented with a variable resistor. The third resistor VR3 and the fourth resistor VR4 may be implemented with termination resistors of the receiver 445.

In an example embodiment, the filter 430 may be implemented with a band pass filter (BPF). The filter 430 may include a pass band corresponding to a frequency band that is higher than a first cutoff frequency and is lower than a second cutoff frequency, a first stop band corresponding to a frequency band that is lower than the first cutoff frequency, and a second stop band corresponding to a frequency band that is higher than the second cutoff frequency. The second cutoff frequency may be higher than the first cutoff frequency. The center frequency FC of the communication signal CS may correspond to one of the first stop band and the second stop band. The filter 430 may apply attenuation of 20 dB or more and a gain of −20 dB or less to the stop band.

Also, the filter 430 may be configured to apply attenuation greater than attenuation for the center frequency FC or a gain smaller than a gain for the center frequency FC to a frequency band of any other signal capable of hindering a normal operation of the receiver 445, like the charging signal CRS.

Figure 11:
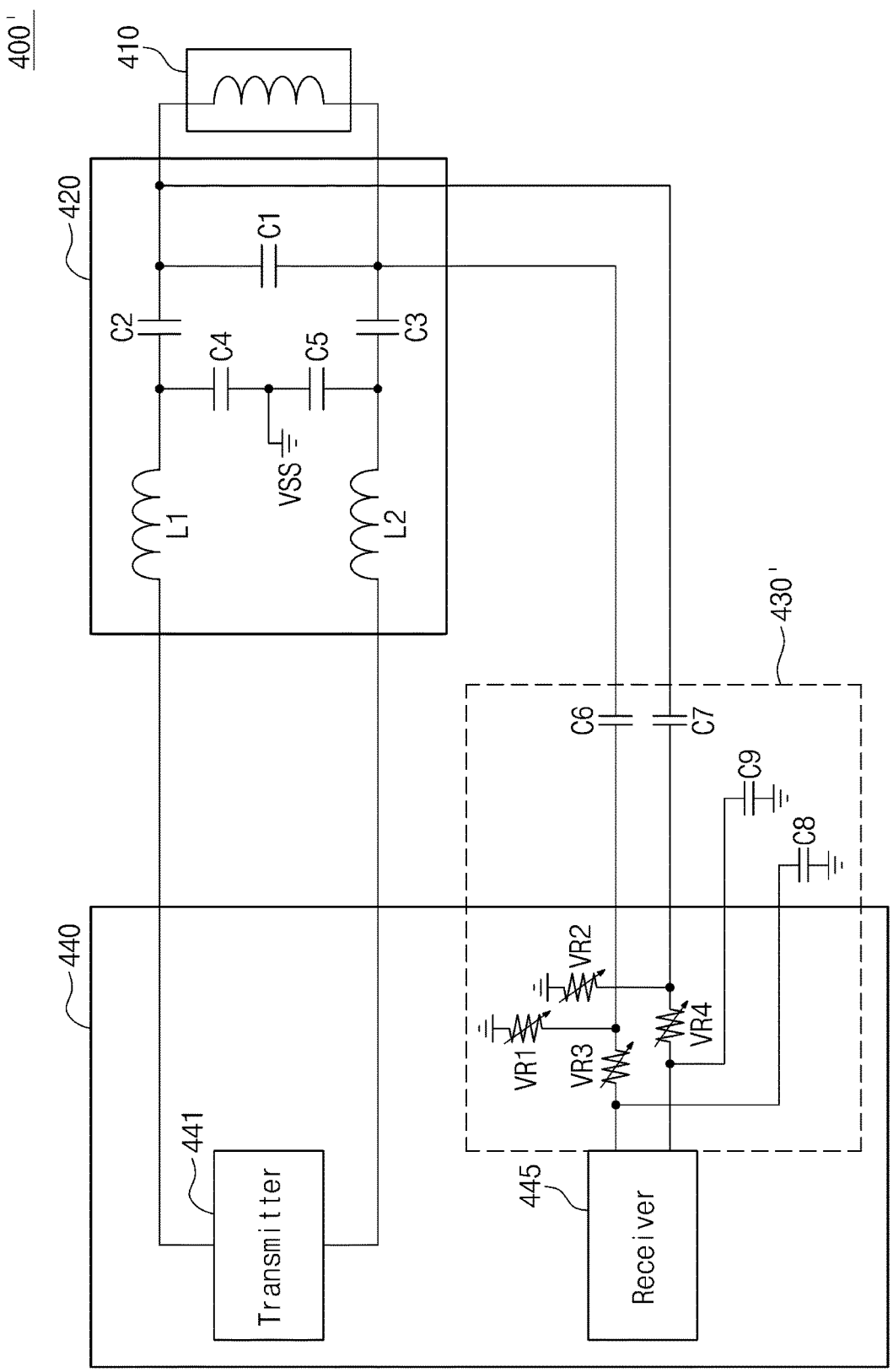
FIG. 11 illustrates an example of a communication device according to an example embodiment.

FIG. 11 illustrates a modified example of the communication device 400 of FIG. 10. Compared to the communication device 400 of FIG. 10, the first resistor VR1, the second resistor VR2, the third resistor VR3, and the fourth resistor VR4 of a filter 430' of a communication device 400' of FIG. 11 may be implemented in the integrated circuit 440. For example, the first resistor VR1, the second resistor VR2, the third resistor VR3, and the fourth resistor VR4 (or any one or any combination thereof) may be implemented with on-chip resistors.

Figure 12:
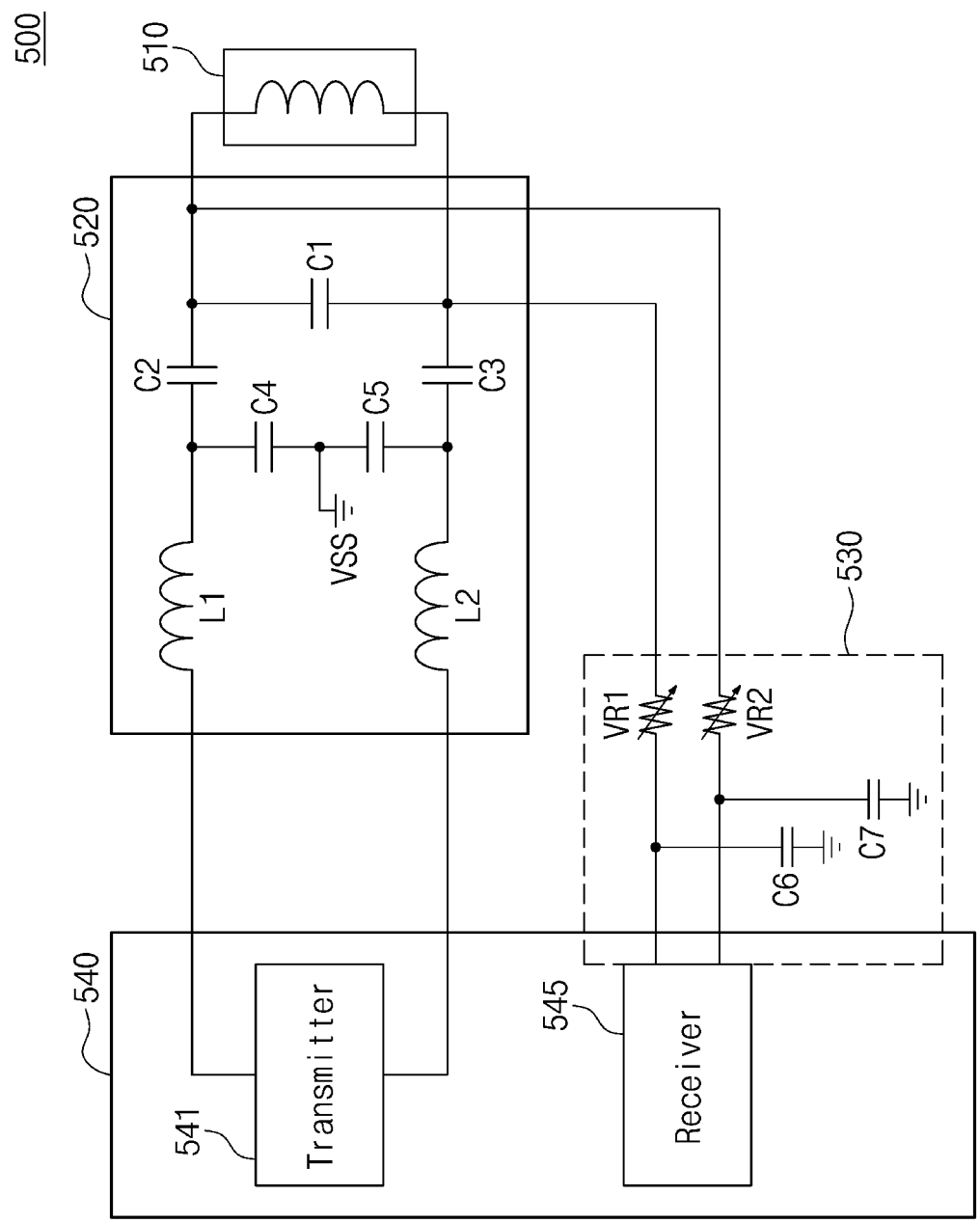
FIG. 12 illustrates an example of a communication device including a filter implemented according to an example embodiment.

FIG. 12 illustrates an example of a communication device 500 including a filter 530 implemented according to a fourth example embodiment. The communication device 500 may be an implementation example of the communication device 100 of FIG. 1. Referring to FIG. 12, the communication device 500 may include an antenna 510, a matching circuit 520, the filter 530, and an integrated circuit 540. The integrated circuit 540 may include a transmitter 541 and a receiver 545.

A configuration and an operation of the antenna 510, the matching circuit 520, the transmitter 541, and the receiver 545 may be substantially similar to those of the antenna 110, the matching circuit 120, the transmitter 141, and the receiver 145 described with reference to FIG. 1. Thus, additional description will be omitted to avoid redundancy.

Referring to FIG. 12, the filter 530 may include the sixth capacitor C6, the seventh capacitor C7, the first resistor VR1, and the second resistor VR2. The first resistor VR1 may be connected between a second node of the antenna 510 and a second node of the receiver 545. The sixth capacitor C6 may be connected between the second node of the receiver 545 and the ground node. The second resistor VR2 may be connected between a first node of the antenna 510 and a first node of the receiver 545. The seventh capacitor C7 may be connected between the first node of the receiver 545 and the ground node.

In an example embodiment, any one or any combination of the first resistor VR1 and the second resistor VR2 may be implemented with a variable resistor. The first resistor VR1 and the second resistor VR2 may be implemented with termination resistors of the receiver 545.

In an example embodiment, the filter 530 may be implemented with a low pass filter (LPF). The filter 530 may include a pass band corresponding to a frequency band lower a cutoff frequency and a stop band corresponding to a frequency band higher than the cutoff frequency. The center frequency FC of the communication signal CS may correspond to the stop band. The filter 530 may apply attenuation of 20 dB or more and a gain of −20 dB or less to the stop band.

Also, the filter 530 may be configured to apply attenuation greater than attenuation for the center frequency FC or a gain smaller than a gain for the center frequency FC to a frequency band of any other signal capable of hindering a normal operation of the receiver 545, like the charging signal CRS.

Figure 13:
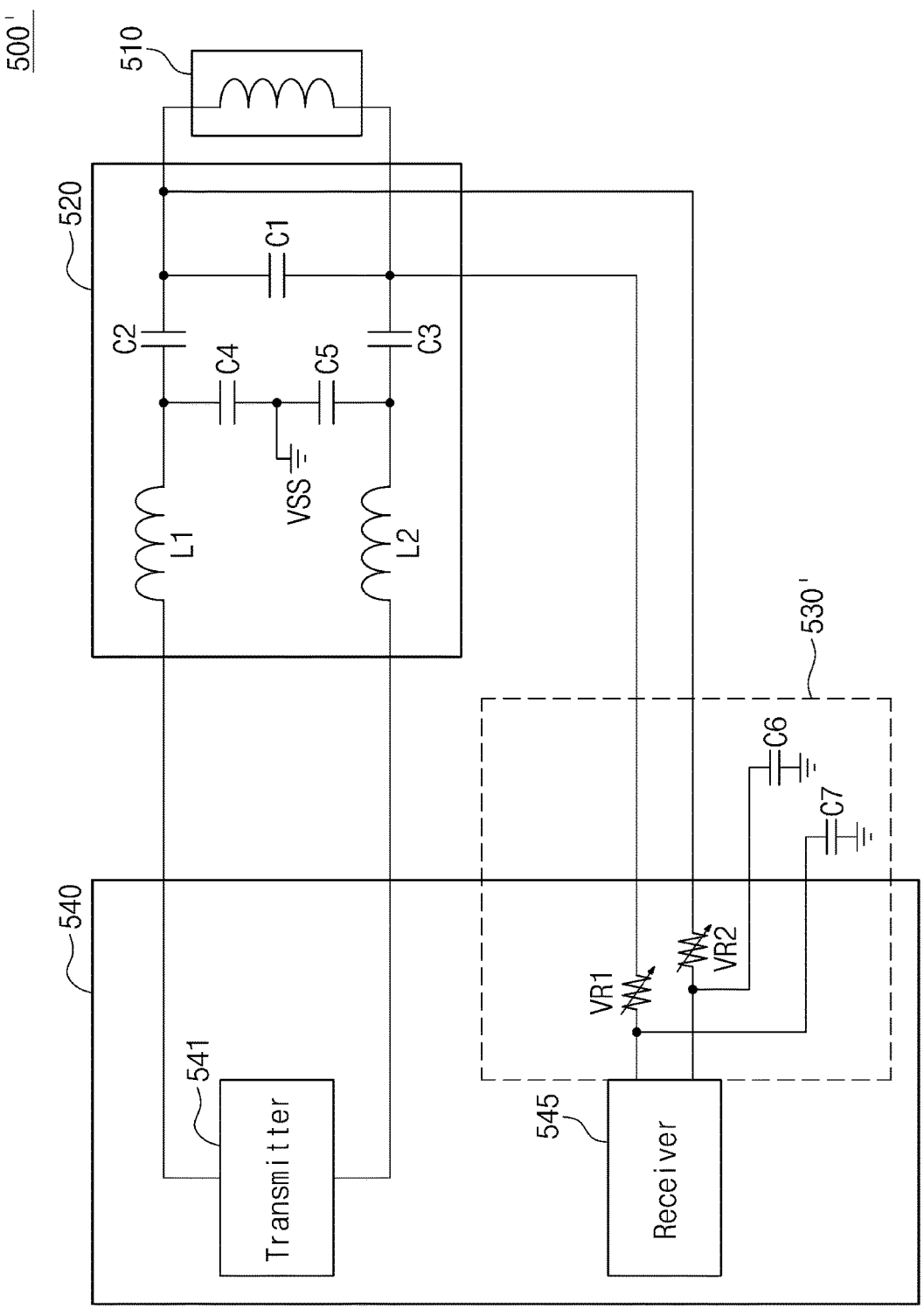
FIG. 13 illustrates an example of a communication device according to an example embodiment.

FIG. 13 illustrates a modified example of the communication device 500 of FIG. 12. Compared to the communication device 500 of FIG. 12, the first resistor VR1 and the second resistor VR2 of a filter 530' of a communication device 500' of FIG. 13 (or any one or any combination thereof) may be implemented in the integrated circuit 540. For example, the first resistor VR1 and/or the second resistor VR2 may be implemented with on-chip resistors.

In the above example embodiments, the description is given as resistors may be implemented with on-chip resistors. In addition, at least a part of capacitors of the filter 130, 230, 330, 430, or 530 of the communication device 100, 200, 300, 400, or 500 may be implemented with an on-chip capacitor in the integrated circuit 140, 240, 340, 440, or 540. For example, any one or any combination of the sixth capacitor C6, the seventh capacitor C7, the eighth capacitor C8 and the ninth capacitor C9 may be an on-chip capacitor in the integrated circuit 140, 240, 340, 440, or 540.

In the above example embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above example embodiments, some components are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to example embodiments, a communication device may attenuate a communication signal by using a filter (in contrast to a resistor) and may attenuate a strong signal acting as a noise. Accordingly, a communication device with improved reliability and reduced power consumption, an electronic device including the communication device, and an operating method of the electronic device are provided.

While example embodiments have been shown and described, it will be apparent to those of ordinary skill in the art that various changes and modifications may be made thereto without departing from the spirit and scope of the present disclosure as set forth in the following claims.

What is claimed is:

1. A communication device comprising:
an antenna;
a matching circuit connected with the antenna;
a transmitter configured to generate a transmission communication signal and provide the transmission communication signal to the antenna through the matching circuit;
a filter connected between the matching circuit and the antenna; and
a receiver configured to receive an attenuated signal from the antenna through the filter,
wherein the filter is connected between a first node of the antenna and a first node of the receiver, and between a second node of the antenna and a second node of the receiver,
wherein the filter is configured to pass frequencies of an antenna signal corresponding to a pass band and attenuate frequencies of the antenna signal corresponding to a stop band, and
wherein a center frequency of the transmission communication signal corresponds to the stop band of the filter.

2. The communication device of claim 1, wherein the receiver is further configured to extract information from the attenuated signal.

3. The communication device of claim 1, wherein the filter is further configured to attenuate the center frequency at an attenuation rate of at least 20 dB.

4. The communication device of claim 1, wherein the filter comprises:
a first capacitor connected between the first node of the antenna and the first node of the receiver;
a second capacitor connected between the second node of the antenna and the second node of the receiver;
a first resistor connected between the first node of the receiver and a ground node; and
a second resistor connected between the second node of the receiver and the ground node.

5. The communication device of claim 4, wherein the first resistor and the second resistor are variable resistors.

6. The communication device of claim 4, wherein the transmitter, the receiver, the first resistor, and the second resistor are provided on an integrated circuit.

7. The communication device of claim 4, wherein each of the first capacitor and the second capacitor has a capacitance ranging from 5 pF to 10 pF.

8. The communication device of claim 4, wherein each of the first resistor and the second resistor has a resistance value ranging from 100 ohm to 200 ohm.

9. The communication device of claim 1, wherein the filter comprises:
a first capacitor and a second capacitor connected in series between the first node of the antenna and the first node of the receiver;
a third capacitor and a fourth capacitor connected in series between the second node of the antenna and the second node of the receiver;
a first resistor connected between a ground node and a node that is provided between the first capacitor and the second capacitor;
a second resistor connected between the ground node and a node that is provided between the third capacitor and the fourth capacitor;
a third resistor connected between the first node of the receiver and the ground node; and
a fourth resistor connected between the second node of the receiver and the ground node.

10. The communication device of claim 9, wherein any one or any combination of the transmitter, the receiver, and the first to fourth resistors are provided on an integrated circuit.

11. The communication device of claim 1, wherein the filter comprises:
a first capacitor and a first resistor connected in series between the first node of the antenna and the first node of the receiver;
a second capacitor and a second resistor connected in series between the second node of the antenna and the second node of the receiver;
a third resistor connected between a ground node and a node that is provided between the first capacitor and the first resistor;
a fourth resistor connected between the ground node and a node that is provided between the second capacitor and the second resistor;
a third capacitor connected between the first node of the receiver and the ground node; and
a fourth capacitor connected between the second node of the receiver and the ground node.

12. The communication device of claim 1, wherein the filter comprises:
a first resistor connected between the first node of the antenna and the first node of the receiver;
a second resistor connected between the second node of the antenna and the second node of the receiver;
a first capacitor connected between the first node of the receiver and a ground node; and
a second capacitor connected between the second node of the receiver and the ground node.

13. An electronic device comprising:
a wireless charger circuit configured to exchange power with an external power device through a charging signal;
a power management integrated circuit configured to provide power received from the wireless charger circuit to a battery or to output power from the battery through the wireless charger circuit;
a communication device configured to communicate with an external device through a communication signal; and
a processor configured to execute an operating system and applications, and to exchange information with the external device through the communication device,
wherein the power management integrated circuit is further configured to provide power to the communication device and the processor,
wherein the communication device comprises an antenna and a filter configured to pass frequencies of the communication signal corresponding to a pass band and attenuate frequencies of the communication signal corresponding to a stop band,
wherein the filter is connected to a first node of the antenna and a second node of the antenna, and wherein a frequency of the charging signal and a center frequency of the communication signal correspond to the stop band of the filter.

14. The electronic device of claim 13, wherein the filter is further configured to:
    attenuate the center frequency of the communication signal at an attenuation rate of at least 20 dB, and
    attenuate the frequency of the charging signal at an attenuation rate of at least 60 dB.

15. The electronic device of claim 13, wherein the filter is implemented with any one at least of a low pass filter (LPF), a high pass filter (HPF), and a band pass filter.

16. The electronic device of claim 13, wherein the frequency of the communication signal is between approximately 10 megahertz and 100 megahertz, and the frequency of the charging signal between approximately 100 kilohertz and 1000 kilohertz.

17. The electronic device of claim 13, wherein the communication device comprises:
    a matching circuit connected with the antenna;
    a transmitter configured to generate a transmission communication signal and provide the transmission communication signal to the antenna through the matching circuit; and
    a receiver configured to receive an attenuated signal from the antenna through the filter, and
    wherein the filter is connected between the matching circuit and the antenna.

18. An operating method of an electronic device which includes an antenna, a filter, and a receiver, the operating method comprising:
    generating, at the filter, an attenuated signal by filtering an antenna signal provided on the antenna; and
    extracting, at the receiver, information from the attenuated signal,
    wherein the filter is connected between a first node of the antenna and a first node of the receiver, and between a second node of the antenna and a second node of the receiver,
    wherein the filter is configured to pass frequencies corresponding to a pass band and attenuate frequencies corresponding to a stop band, and
    wherein a center frequency of a communication signal of the receiver corresponds to the stop band of the filter.

19. The operating method of claim 18, wherein the electronic device further includes a wireless charger circuit,
    wherein the operating method further comprises performing, at the wireless charger circuit, wireless charging through a charging signal, and
    wherein a frequency of the charging signal corresponds to the stop band of the filter.

20. The operating method of claim 19, wherein an attenuation rate of the filter associated with the frequency of the charging signal is greater than an attenuation rate of the filter associated with the center frequency of the communication signal.

* * * * *